(12) United States Patent
Kato

(10) Patent No.: US 7,491,609 B2
(45) Date of Patent: Feb. 17, 2009

(54) SEMICONDUCTOR DEVICE AND METHOD FOR MANUFACTURING THE SAME

(75) Inventor: Juri Kato, Nagano-Ken (JP)

(73) Assignee: Seiko Epson Corporation, Tokyo (JP)

( * ) Notice: Subject to any disclaimer, the term of this patent is extended or adjusted under 35 U.S.C. 154(b) by 477 days.

(21) Appl. No.: 11/212,519

(22) Filed: Aug. 25, 2005

(65) Prior Publication Data
US 2006/0046393 A1 Mar. 2, 2006

(30) Foreign Application Priority Data
Aug. 26, 2004 (JP) ............................. 2004-246363

(51) Int. Cl.
*H01L 21/336* (2006.01)
(52) U.S. Cl. ................ 438/268; 438/139; 438/166; 438/295; 438/479; 438/481; 257/347; 257/E21.561; 257/E21.57; 257/369
(58) Field of Classification Search ................ 257/369, 257/347, E21.561, E21.57, E29.287; 438/268, 438/139, 166
See application file for complete search history.

(56) References Cited

U.S. PATENT DOCUMENTS

| | | | |
|---|---|---|---|
| 5,371,604 A | 12/1994 | Gotou et al. | |
| 5,410,165 A | 4/1995 | Kasai et al. | |
| 5,807,772 A | 9/1998 | Takemura et al. | |
| 5,917,221 A | 6/1999 | Takemura et al. | |
| 6,048,142 A | 4/2000 | Hashimoto et al. | |
| 6,340,830 B1 | 1/2002 | Takemura et al. | |
| 6,528,852 B2 | 3/2003 | Takemura et al. | |
| 6,750,486 B2 * | 6/2004 | Sugawara et al. | ............ 257/265 |
| 6,815,772 B2 | 11/2004 | Takemura et al. | |
| 6,960,781 B2 * | 11/2005 | Currie et al. | .................. 257/19 |
| 7,034,362 B2 * | 4/2006 | Rim | ............................. 257/351 |
| 2004/0023526 A1 | 2/2004 | Shimada | |

FOREIGN PATENT DOCUMENTS

| | | |
|---|---|---|
| JP | 03-054865 | 3/1991 |
| JP | 05-335521 | 12/1993 |
| JP | 05-343686 | 12/1993 |
| JP | 05-343689 | 12/1993 |
| JP | 07-211917 | 8/1995 |
| JP | 08-037306 | 2/1996 |
| JP | 09-045909 | 2/1997 |
| JP | 09-116036 | 5/1997 |
| JP | 09-205211 | 8/1997 |
| JP | 2000-010120 | 1/2000 |
| JP | 2002-33481 | 1/2002 |
| JP | 2003-324200 | 11/2003 |
| WO | WO-03-103063 | 12/2003 |

OTHER PUBLICATIONS

Sakai, et al, "Separation by Bonding Si Islands (SBSI) for LSI Applications"; Second International SiGe Technology and Device Meeting, May 2004, pp. 230-231.

* cited by examiner

*Primary Examiner*—Marcos D Pizarro
*Assistant Examiner*—Marc Armand
(74) *Attorney, Agent, or Firm*—Edwards Angell Palmer & Dodge LLP; John J. Penny, Jr.; George N. Chaclas

(57) ABSTRACT

A semiconductor device includes a gate electrode formed on a semiconductor layer, source and drain layers formed in the semiconductor layer and disposed on both sides of the gate electrode, and a field plate disposed at the back of the semiconductor layer with an insulating layer provided therebetween.

7 Claims, 16 Drawing Sheets

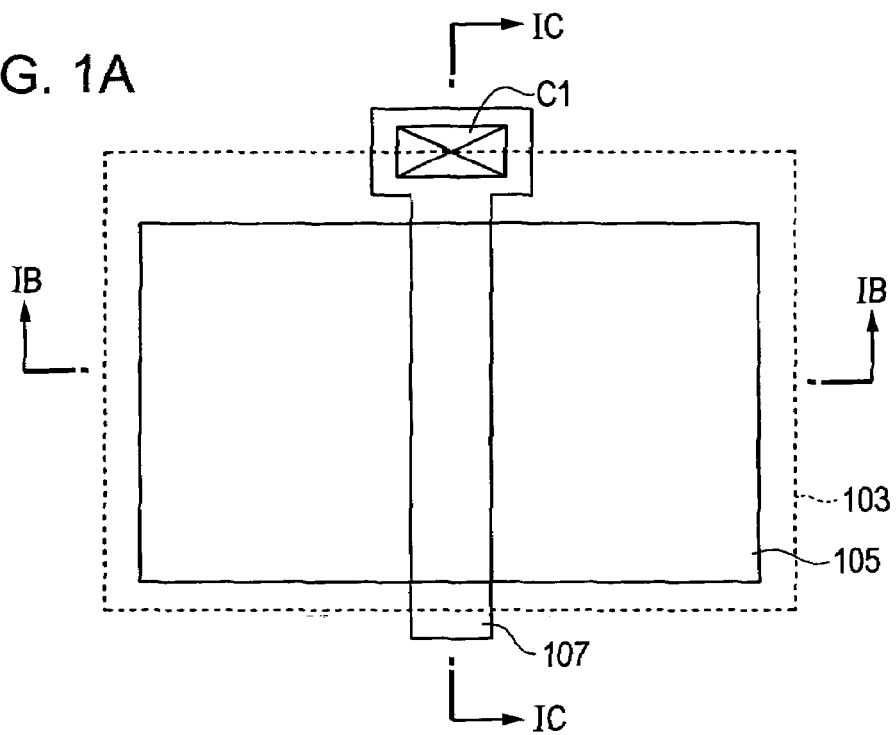
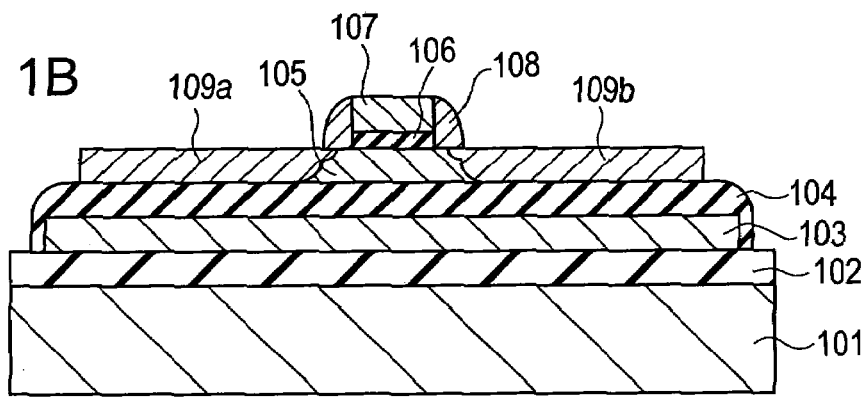
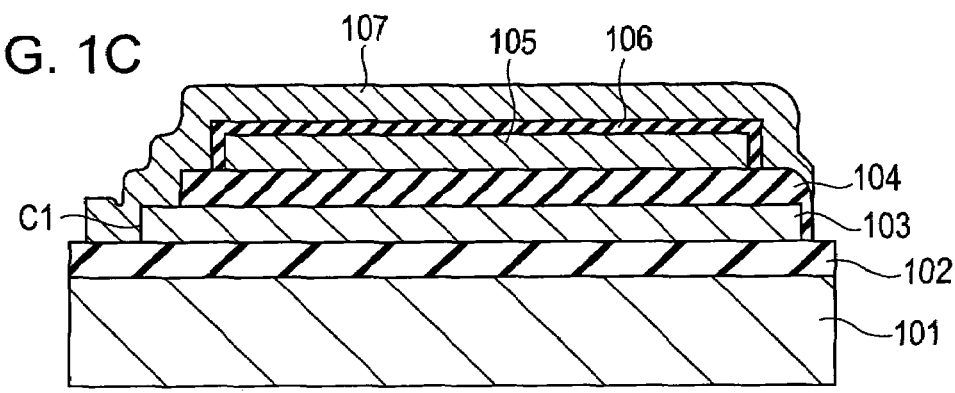

SEMICONDUCTOR DEVICE AND METHOD FOR MANUFACTURING THE SAME

BACKGROUND OF THE INVENTION

This application claims the benefit of Japanese application Ser. No. 2004-246363, filed Aug. 26, 2004, pursuant to 35 U.S.C. 119, the disclosure of which is incorporated herein in its entirety by this reference.

TECHNICAL FIELD

The invention relates to a semiconductor device and a method for manufacturing the same, which are particularly suitable for application to a method for forming a field plate.

RELATED ART

In a method for manufacturing a related-art semiconductor device, in order to achieve the higher breakdown voltage of a field-effect transistor, a field plate is formed on an insulating film which covers the field-effect transistor, and the field plate is connected to a gate or source, as disclosed in, for example, Japanese Unexamined Patent Application Publication Nos. 9-45909 and 9-205211.

Also, for example, Japanese Unexamined Patent Application Publication No. 7-211917 discloses a method in which in order to improve the breakdown voltage of a drain, an offset gate region is provided so that the impurity concentration increases stepwise from the gate region side to the drain region side.

Furthermore, for example, Japanese Unexamined Patent Application Publication No. 8-37306 discloses a method in which in order to improve the breakdown voltage of a SOI (Silicon On Insulator) transistor, a drain electrode in contact with a drain diffusion region is formed at a depth reaching an insulating substrate from the surface of a silicon active layer.

However, in a related-art field plate structure, a field plate is formed on an insulating film which covers a field-effect transistor, and thus the field plate must be disposed so as to avoid a gate electrode and source-drain contact, resulting in the problem of decreasing the breakdown voltage due to concentration of an electric field at the end of the gate and the end of the field plate.

Also, in the SOI transistor, when a drain voltage is supplied from the surface of a Si thin film of the SOI, a high voltage is applied to the interface between an offset layer and a high-concentration impurity diffused layer of a drain and a buried oxide film. As a result, a strong electric field locally occurs at the interface between the offset layer and the high-concentration impurity diffused layer of the drain and the buried oxide film, thereby causing the problem of inhibiting improvement in the breakdown voltage of the SOI transistor.

SUMMARY

An advantage of at least one aspect of the invention is that it provides a semiconductor device permitting the formation of a field plate while easing limitation of arrangement of the field plate, and a method for manufacturing the semiconductor device.

According to an aspect of the invention, a semiconductor device comprises a gate electrode formed on a semiconductor layer, source and drain layers formed in the semiconductor layer and disposed on the sides of the gate electrode, and a field plate disposed at the back of the semiconductor layer with an insulating layer provided therebetween.

Therefore, the degree of freedom of arrangement of the field plate can be improved, and the field plate can be disposed in a portion where an electric field is concentrated without undergoing limitations of arrangement of the gate electrode and source-drain contact. As a result, the degree of design freedom of a field-effect transistor can be improved, and the breakdown voltage of the field-effect transistor can be also improved.

It is preferable that the semiconductor layer is formed on an insulating substrate and includes a polycrystalline or amorphous semiconductor.

In this case, a TFT (Thin Film Transistor) structure can be formed while improving the degree of freedom of arrangement of the field plate, and thus a high-breakdown voltage IC with high reliability can be provided at low cost.

It is also preferable that the semiconductor layer is formed on a semiconductor substrate with an insulating film provided therebetween, and the semiconductor layer includes a single crystal semiconductor.

In this case, a SOI transistor can be formed on the semiconductor substrate while improving the degree of freedom of arrangement of the field pate. Therefore, it is possible to form a transistor which can be decreased in power consumption while improving the breakdown voltage and which can be operated at a high speed and can be easily driven at a low voltage.

Also, since the field plate is disposed at the back of the semiconductor layer, a drain potential can be shielded by the field plate. Therefore, when the drain potential is supplied from the surface of a Si thin film of the SOI, a high voltage can be prevented form being applied to an interface between an offset layer and a high-concentration impurity diffused layer of the drain and a buried oxide film. As a result, a strong electric field can be also prevented from locally occurring at the interface between the offset layer and the high-concentration impurity diffused layer of the drain and the buried oxide film, thereby improving the breakdown voltage of the SOI transistor.

It is also preferable that the field plate is set at the same potential as that of the gate electrode or the source layer and is extended from a channel region through the channel end on the drain side.

In this case, the electric field at the channel end on the drain side can be relaxed, and thus the breakdown voltage of the field-effect transistor can be improved.

Furthermore, when a lower electrode of the field plate is connected to the gate electrode, the rising of a current in a subthreshold region can be made steep (s (subthreshold) value close to 60 mV/dec), thereby enabling low-power driving.

It is further preferable that the field plate is set at the same potential as the gate electrode or the source layer and is extended from the channel region through the end of the gate electrode on the drain side.

In this case, the electric field at the end of the gate electrode on the drain side can be relaxed, and the breakdown voltage of the field-effect transistor can be improved.

It is preferable that an offset gate layer is further provided in the semiconductor layer so as to be disposed between the gate electrode and the drain layer, the field plate is set at the same potential as the gate electrode or the source layer and is extended from the channel region through the end of the offset gate layer.

In this case, the electric field at the end of the offset gate layer can be relaxed, and the breakdown voltage of the field-effect transistor can be improved.

It is further preferable that the field plate includes a projecting portion projecting outward from the semiconductor layer, and the gate electrode or the source layer is connected to the projecting portion of the field plate.

In this case, when the field plate is disposed at the back of the semiconductor layer, the field plate can be easily connected to the gate electrode or the source layer. Therefore, the degree of freedom of arrangement of the field plate can be improved while suppressing complication of the manufacturing process, and thus the breakdown voltage of the field-effect transistor can be improved.

According to another embodiment of the invention, a method for manufacturing a semiconductor device comprises depositing a first semiconductor layer on a first insulating layer, forming a second semiconductor layer on the first semiconductor layer with a second insulating layer provided therebetween, patterning the second semiconductor layer to partially expose the second insulating layer, patterning the exposed portion of the second insulating layer and the first semiconductor layer to partially expose the first insulating layer so that the first semiconductor layer projects from the second semiconductor layer, thermally oxidizing the second semiconductor layer to form a gate insulating film on the surface of the second semiconductor layer, removing the second insulating layer from a portion of the first semiconductor layer which projects from the second semiconductor layer, forming a gate electrode on the gate insulating film so that the gate electrode is connected to the first semiconductor layer, and forming source and drain layers in the second semiconductor layer on both sides of the gate electrode.

In this case, the first semiconductor layer can be caused to function as a field plate, and a SOI transistor can be formed in the second semiconductor layer. Also, the field plate can be disposed at the back of the semiconductor layer in which the SOI transistor is formed. Therefore, the field plate can be disposed in a portion where an electric field is concentrated without undergoing limitations of arrangement of the gate electrode and the source-drain contact. Furthermore, the threshold value of MOSFET can be controlled by changing the voltage of the field plate. Consequently, the breakdown voltage of a field-effect transistor can be improved while decreasing the power consumption and driving voltage of the field-effect transistor and increasing the operation speed thereof.

According to a further embodiment of the invention, a method for manufacturing a semiconductor device comprises forming a plurality of laminated structure layers on a semiconductor substrate, the laminated structure layers each including a first semiconductor layer and a second semiconductor layer formed on the first semiconductor layer and having a lower etching rate than that of the first semiconductor layer; providing a step to expose the surface of the second semiconductor layer in the lower laminated structure layer and forming a first groove passing through the first and second semiconductor layers to expose the semiconductor substrate; forming supports on the side walls of the first and second semiconductor layers within the groove, for supporting the second semiconductor layers on the semiconductor substrate; forming a second groove to expose at least a portion of the first semiconductor layers, on which the supports have been formed on the side walls, from the second semiconductor layers; selectively etching the first semiconductor layers through the second groove to partially remove the first semiconductor layers; thermally oxidizing the semiconductor substrate and the second semiconductor layers through the first and second grooves to form insulating layers at the back of the second semiconductor layers; thermally oxidizing the uppermost second semiconductor layer to form a gate insulating film on the uppermost second semiconductor layer; forming a gate electrode on the uppermost second semiconductor layer with the gate insulating film formed therebetween; and implanting ions using the gate electrode as a mask to form source and drain layers in the uppermost second semiconductor layer on both sides of the gate electrode.

In this case, a BOX (Buried Oxide) layer can be formed by thermally oxidizing a semiconductor layer, and thus a SOI transistor can be formed without deteriorating the crystal quality of the semiconductor layer. Also, a field plate can be formed at the back of the semiconductor layer in which a SOI transistor is formed. Therefore, the field plate can be disposed in a portion where an electric field is concentrated without undergoing limitations of arrangement of the gate electrode and the source-drain contact. Consequently, the breakdown voltage of a field-effect transistor can be improved while decreasing the power consumption and driving voltage of the field-effect transistor and increasing the operation speed thereof.

BRIEF DESCRIPTION OF THE DRAWINGS

The invention will be described with reference to the accompanying drawings, wherein like numbers reference like elements, and wherein:

FIGS. 1A, 1B, and 1C are drawings schematically showing the configuration of a semiconductor device according to a first embodiment of the invention;

DESCRIPTION OF THE EMBODIMENTS

Figure 2A:
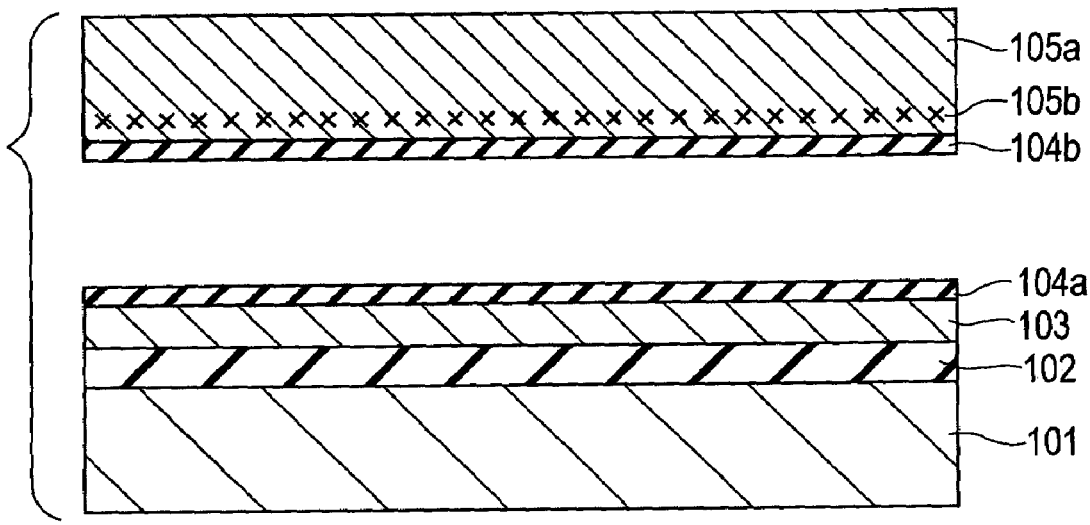
FIGS. 2A, 2B, and 2C are sectional views showing a method for manufacturing the semiconductor device shown in FIGS. 1A, 1B, and 1C.

Semiconductor devices and methods for manufacturing the semiconductor devices according to respective embodiments of the invention will be described with reference to the drawings.

FIG. 1A is a plan view showing the schematic configuration of a semiconductor device according to a first embodiment of the invention, FIG. 1B is a sectional view taken along line IB-IB in FIG. 1A, and FIG. 1C is a sectional view taken along line IC-IC in FIG. 1A.

In FIGS. 1A, 1B, and 1C, an insulating layer 102 is formed on a semiconductor substrate 101, and a semiconductor layer 103 is formed on the insulating layer 102. The semiconductor layer 103 can be mesa-isolated. Also, an insulating layer 104 is formed on the semiconductor layer 103, and a semiconductor layer 105 is formed on the insulating layer 104. The semiconductor layer 105 can be mesa-isolated so that a portion of the semiconductor layer 103 projects from the semiconductor layer 105.

As a material for the semiconductor substrate 101 and the semiconductor layers 103 and 105, for example, Si, Ge, SiGe, SiC, SiSn, PbS, GaAs, InP, GaP, GaN, ZnSe, or the like can be used. As the insulating layers 102 and 104, for example, an insulating layer or a buried insulating film of $SiO_2$, SiON, $Si_3N_4$, or the like can be used. Also, as the semiconductor substrate 101 on which the semiconductor layer 103 is formed on the insulating layer 102, for example, a SOI substrate can be used. Examples of the SOI substrate include a SIMOX (Separation by Implanted Oxygen) substrate, a bonded substrate, a laser-annealed substrate, and the like. Instead of the semiconductor substrate 101, an insulating substrate such as a sapphire, glass, or ceramic substrate may be used. For the semiconductor layers 103 and 105, a single crystal semiconductor, a polycrystalline semiconductor, or an amorphous semiconductor may be used. Instead of the semiconductor layer 103, a high-melting-point metal such as W or Mo may be used.

Furthermore, a gate electrode 107 is formed on the semiconductor layer 105 with a gate insulating film 106 provided therebetween, and side walls 108 are formed on the gate electrode 107. In addition, source and drain layers 109a and 109b are formed in the semiconductor layer 105 so as to be disposed one both sides of the gate electrode 107 through LDD layers.

In the semiconductor layer 103, the insulating layer 104 is removed from the portion of the semiconductor layer 103, which projects from the semiconductor layer 105, to form a contact region CI. The gate electrode 107 is extended to the contact region CI of the semiconductor layer 103 and is connected to the semiconductor layer 103 through the contact region CI.

Therefore, the semiconductor layer 103 can be used as a field plate, and the field plate can be disposed at the back of the semiconductor layer 105 in which a field-effect transistor is formed. As a result, the degree of freedom of arrangement of the field plate can be improved, and the field plate can be disposed in a portion where an electric field is concentrated without undergoing limitations of arrangement of the gate electrode 107 and wiring layers. Consequently, the degree of design freedom of the field-effect transistor can be improved, and the breakdown voltage of the field-effect transistor can be also improved.

When the field plate is disposed at the back of the semiconductor layer 105, a drain potential can be shielded by the field plate, and a SOI transistor can be formed on the semiconductor substrate 101. Therefore, even when the drain potential is applied from the surface of the semiconductor layer 103, a high voltage can be prevented from being applied to an interface between the drain layer 109b and the insulating layer 102. As a result, a strong electric field can be prevented from being locally applied to an interface between the drain layer 109b and the insulating layer 102, thereby increasing the breakdown voltage of the field-effect transistor while decreasing the power consumption and driving voltage and increasing the operation speed.

The field plate is preferably extended from a channel region through the channel end on the drain layer 109b side or the end of the gate electrode 107. The size of the semiconductor layer 103 may be larger than that of the semiconductor layer 105. In this case, the end of the field plate can be prevented from overlapping the semiconductor layer 103, and thus the breakdown voltage of the field-effect transistor formed in the semiconductor layer 105 can be improved.

FIGS. 2A to 3D are sectional views showing a method for manufacturing the semiconductor device shown in FIGS. 1A, 1B, and 1C.

In FIG. 2A, an insulating layer 104b is deposited on a semiconductor substrate 105a by, for example, plasma CVD or the like. Then, about $10^{16}/cm^{-2}$ of hydrogen ions are implanted in the semiconductor substrate 105a on which the insulating layer 104b has been deposited to form a hydrogen ion-implanted layer 105b in the semiconductor substrate 105a. The depth of the hydrogen ion-implanted layer 105b in the semiconductor substrate 105a can be determined to be larger than the thickness of the semiconductor layer 105.

On the other hand, the insulating layer 102 is formed on the semiconductor substrate 101, and the semiconductor layer 103 is formed on the insulating layer 102. Also, an insulating layer 104a is deposited on the semiconductor layer 103 by plasma CVD or the like. The semiconductor layer 103 is preferably doped with impurities of As, P, B, or the like to decrease the resistivity of the semiconductor layer 103.

The insulating layer 104b deposited on the semiconductor substrate 105a and the insulating layer 104a deposited on the semiconductor layer 103 are bonded together. Then, the semiconductor substrate 105a is heat-treated at a temperature of about 400° C. to 600° C. to bring about separation from the semiconductor substrate 105a at the hydrogen ion-implanted layer 105b as a boundary and form the semiconductor layer 105 bonded to the semiconductor substrate 101.

Figure 2B:
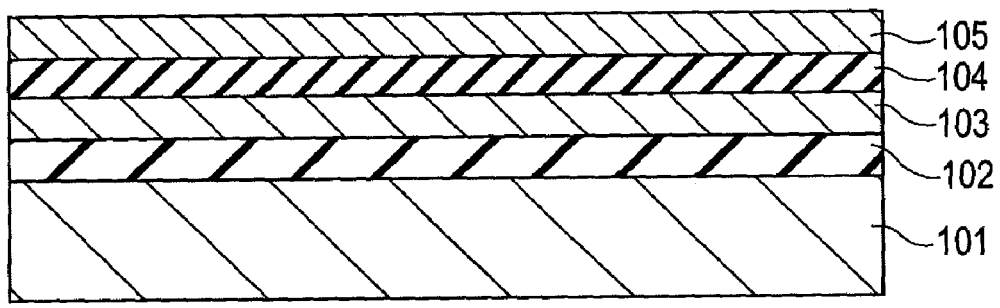

Next, as shown in FIG. 2B, the surface of the semiconductor layer 105 bonded to the semiconductor substrate 101 is planarized to form the semiconductor layer 105 disposed on the semiconductor layer 103 with the insulating layer 104 provided therebetween. As a method for planarizing the surface of the semiconductor layer 105, for example, CMP (chemical mechanical polishing) can be used.

Figure 2C:
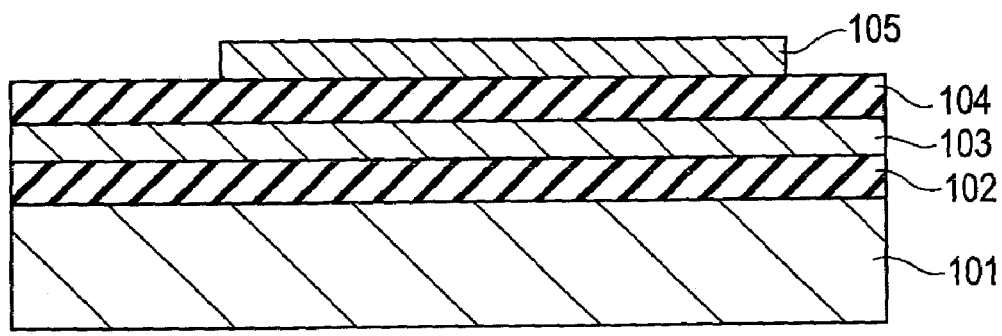

Next, as shown in FIG. 2C, the semiconductor layer 105 is patterned by photolithography and etching to mesa-isolate the semiconductor layer 105.

Figure 3A:
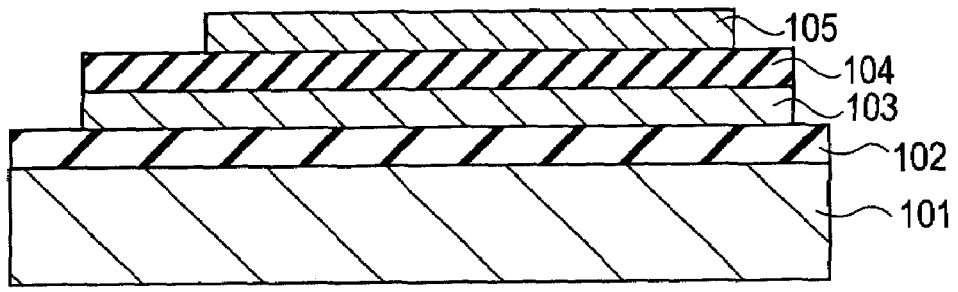
FIGS. 3A, 3B, 3C, and 3D are: sectional views showing the method for manufacturing the semiconductor device shown in FIGS. 1A, 1B, and 1C.

Next, as shown in FIG. 3A, the insulating layer 104 and the semiconductor layer 103 are patterned by photolithography and etching to mesa-isolate the semiconductor layer 103. In patterning the semiconductor layer 103, the semiconductor layer 103 can be mesa-isolated so as to partially project from the semiconductor layer 105.

Figure 3B:
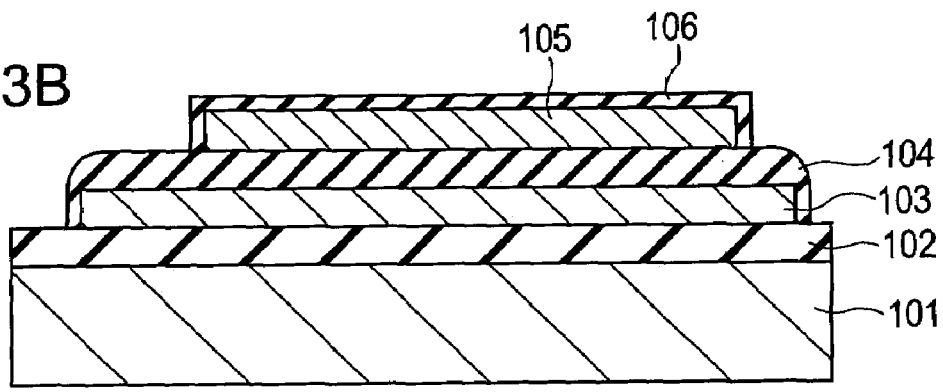

Next, as shown in FIG. 3B, the semiconductor layer 105 is thermally oxidized to form the gate insulating film 106 on the surface of the semiconductor layer 105.

Figure 3C:
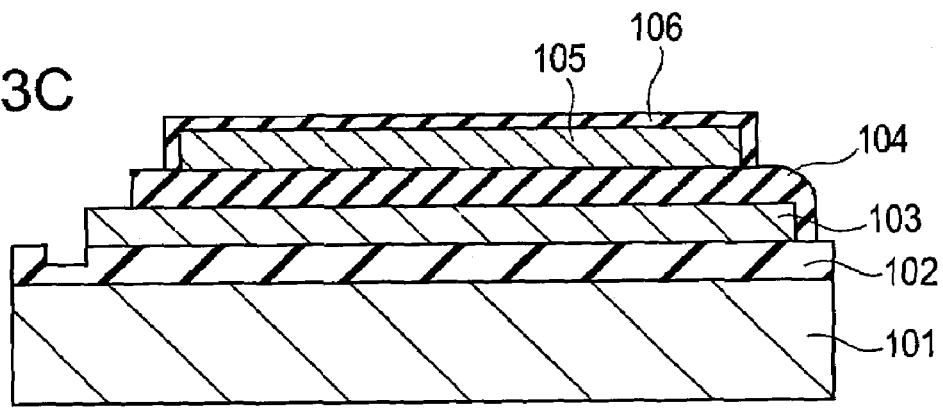

Next, as shown in FIG. 3C, the insulating layer 104 is patterned by photolithography and etching to expose the portion of the surface of the semiconductor layer 103 which projects from the semiconductor layer 105 and form the contact region CI in the semiconductor layer 103.

Figure 3D:
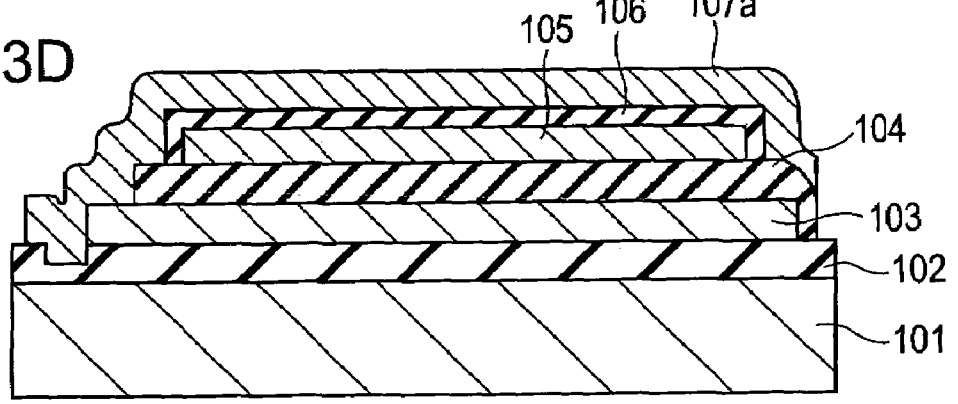

Next, as shown in FIG. 3D, a conductive film 107a is deposited over the entire surface of the semiconductor substrate 101 by plasma CVD or the like. For the conductor film 107a, for example, polycrystalline silicon can be used.

Next, as shown in FIGS. 1A, 1B, and 1C, the conductive film 107a is patterned by photolithography and etching to form the gate electrode 107 on the semiconductor layer 105, the gate electrode 107 being connected to the semiconductor layer 103 through the contact region CI.

Then, impurity ions of As, P, B, or the like are implanted in the semiconductor layer 105 through the gate electrode 107 used as a mask to form LDD (Lightly Doped Drain) layers comprising lightly doped impurity layers in the semiconductor layer 105, the LDD layers being disposed on both sides of the gate electrode 107.

Then, an insulating layer is formed, by CVD or the like, on the semiconductor layer 105 in which the LDD layers have been formed, and then the insulating layer is etched back by anisotropic etching such as RIE or the like to form the side walls 108 on the gate electrode 107. Thereafter, impurity ions of As, P, B, or the like are implanted in the semiconductor layer 105 using the gate electrode 107 and the side walls 108 as a mask to form the source and drain layers 109a and 109b comprising heavily-doped impurity layers in the semiconductor layer 105, the source and drain layers 109a and 109b being disposed on both sides of the side walls 108.

Figure 4A:
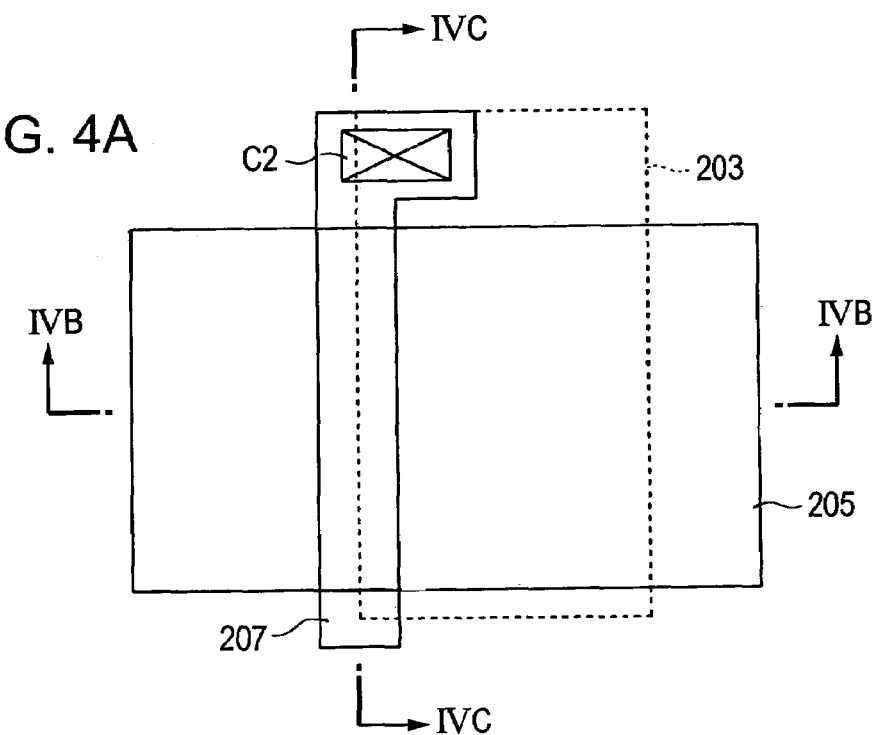
FIGS. 4A, 4B, and 4C are drawings schematically showing the configuration of a semiconductor device according to a second embodiment of the invention.
Figure 4B:
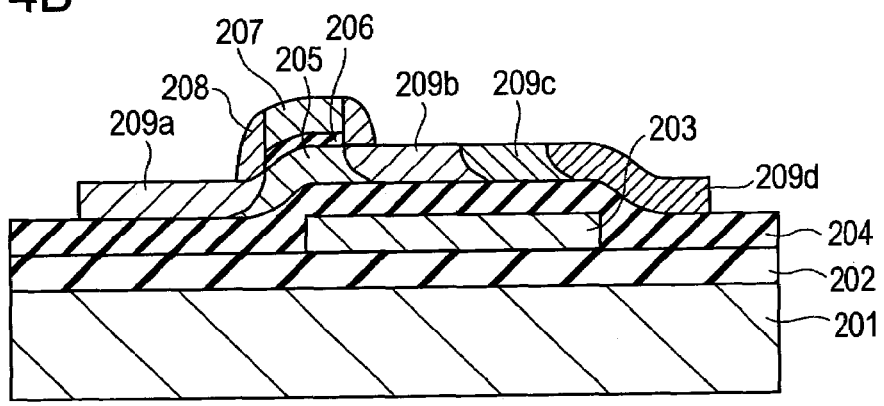
Figure 4C:
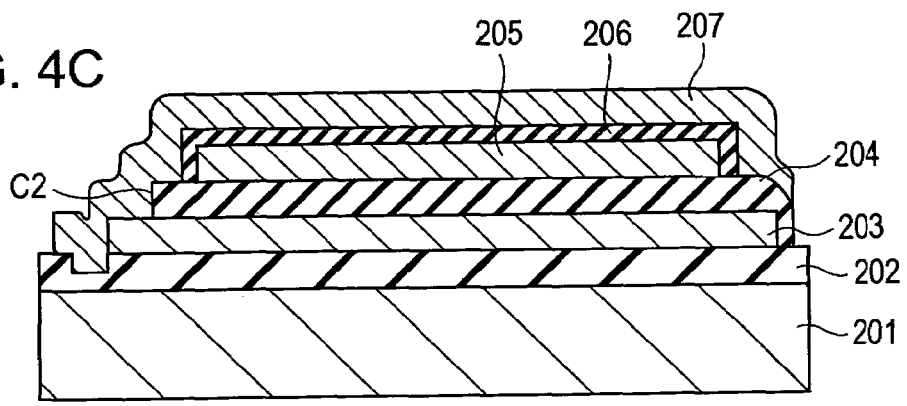

FIG. 4A is a plan view showing the schematic configuration of a semiconductor device according to a second embodiment of the invention, FIG. 4B is a sectional view taken along line IVB-IVB in FIG. 4A, and FIG. 4C is a sectional view taken along line IVC-IVC in FIG. 4A.

In FIGS. 4A, 4B, and 4C, an insulating layer 202 is formed on a semiconductor substrate 201, and a semiconductor layer 203 is formed on the insulating layer 202. The semiconductor layer 203 can be mesa-isolated. Furthermore, an insulating layer 204 is formed on the semiconductor layer 203, and a semiconductor layer 205 is formed on the insulating layer 204. The semiconductor layer 205 can be mesa-isolated so that the semiconductor layer 203 projects from the semiconductor layer 205.

Also, a gate electrode 207 is formed on the semiconductor layer 205 with a gate insulating film 206 provided therebetween, and side walls 208 are formed on the gate electrodes 207. Furthermore, a source layer 209a is formed in the semiconductor layer 205 on one of the sides of the gate electrode 107, and a drain layer 209d is formed in the semiconductor layer 205 on the other side of the gate electrode 207 through offset gate layers 209b and 209c. Each of the offset gate layers 209b and 209c may include an impurity diffused layer at a lower impurity concentration than that of the drain layer 209d, and the impurity concentration can be increased from the body region below the gate electrode 207 toward the drain layer 209d.

In the semiconductor layer 203, the insulating layer 204 is partially removed from the portion of the semiconductor layer 203 projecting from the semiconductor layer 205 to form a contact region C2. The gate electrode 207 is extended to the contact region C2 of the semiconductor layer 203 and connected to the semiconductor layer 203 through the contact region C2.

Therefore, the semiconductor layer 203 can be used as a field plate, and the field plate can be disposed at the back of the semiconductor layer 205 in which a thin film transistor is formed. As a result, the degree of freedom of arrangement of the field plate can be improved, and the field plate can be disposed in a portion where an electric field is concentrated without undergoing limitations of arrangement of the gate electrode 207 and wiring-layers. Consequently, the degree of design freedom of the field-effect transistor can be improved, and the breakdown voltage of the field-effect transistor can be also improved.

When the offset gate layers 209b and 209c are disposed between the gate electrode 207 and the drain layer 209d, the field plate is preferably extended from a channel region through the end of the offset gate layer 209c.

Figure 5A:
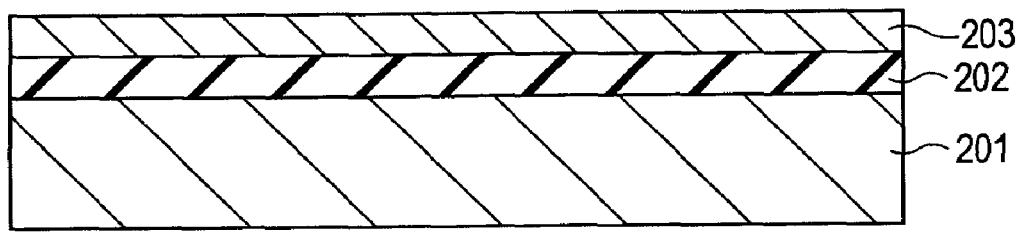
FIGS. 5A, 5B, and 5C are sectional views showing a method for manufacturing the semiconductor device shown in FIGS. 4A, 4B, and 4C.
Figure 5B:
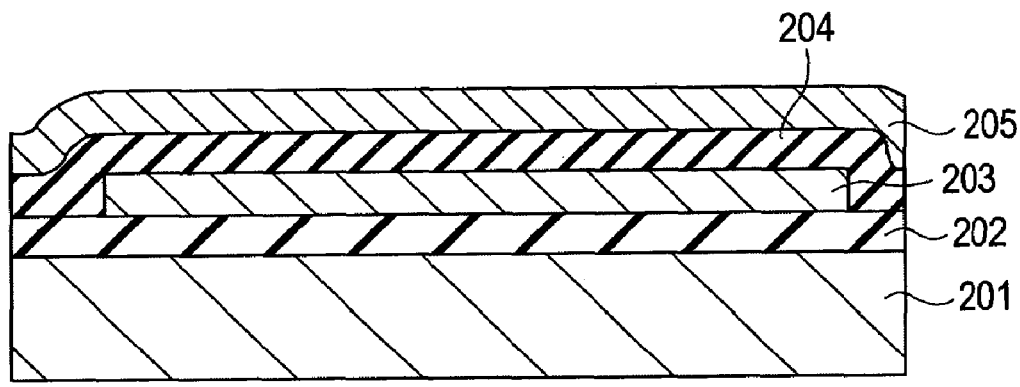
Figure 5C:
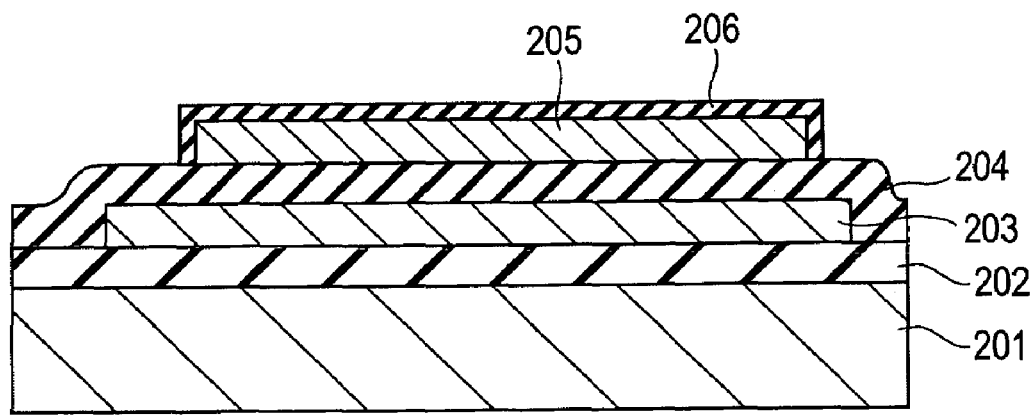

FIGS. 5A, 5B and 5C are sectional views showing a method for manufacturing the semiconductor device shown in FIGS. 4A, 4B, and 4C, taken along line A22-A22' in FIG. 4A. In FIG. 5A, the insulating layer 202 is formed on the semiconductor substrate 201, and the semiconductor layer 203 is formed on the insulating layer 202. The semiconductor layer 203 is preferably doped with impurities of As, P, B, or the like to decrease the resistivity of the semiconductor layer 203.

Next, as shown in FIG. 5B, the semiconductor layer 203 is patterned by photolithography and etching to mesa-isolate the semiconductor layer 203. Then, the insulating layer 204 and the semiconductor layer 205 are deposited in turn on the semiconductor layer 203.

Next, as shown in FIG. 5C, the semiconductor layer 205 is patterned by photolithography and etching to mesa-isolate the semiconductor layer 205. In patterning the semiconductor layer 205, the semiconductor layer 205 can be mesa-isolated so that the semiconductor layer 203 partially projects from the semiconductor layer 205. Then, the semiconductor layer 205 is thermally oxidized to form the gate insulating film 206 on the surface of the semiconductor layer 205.

Next, as shown in FIGS. 4A, 4B, and 4C, the insulating layer 204 is patterned by photolithography and etching to expose the surface of the portion of the semiconductor layer 203, which projects from the semiconductor layer 205, to form the contact region C2 in the semiconductor layer 203. Then, the gate electrode 207 is formed on the semiconductor layer 205 so as to be connected to the semiconductor layer 203 through the contact region C2.

Next, the source layer 209a is formed in the semiconductor layer 205 to be disposed on one of the sides of the gate electrode 207, and the offset gate layers 209b and 209c and the drain layer 209d are formed in the semiconductor layer 205 to be disposed on the other side of the gate electrode 207. Furthermore, the side walls 208 are formed on the gate electrode 207.

FIGS. 6A to 16C are drawings showing a method for manufacturing a semiconductor device according to a third embodiment of the invention. In these drawings, A is a plane view, B is a sectional view taken along each of lines VIB-VIB to XVIB-XVIB in plane views A, and C is a sectional view taken along each of lines VIC-VIC to XVIC-XVIC in plane views A.

Figure 6A:
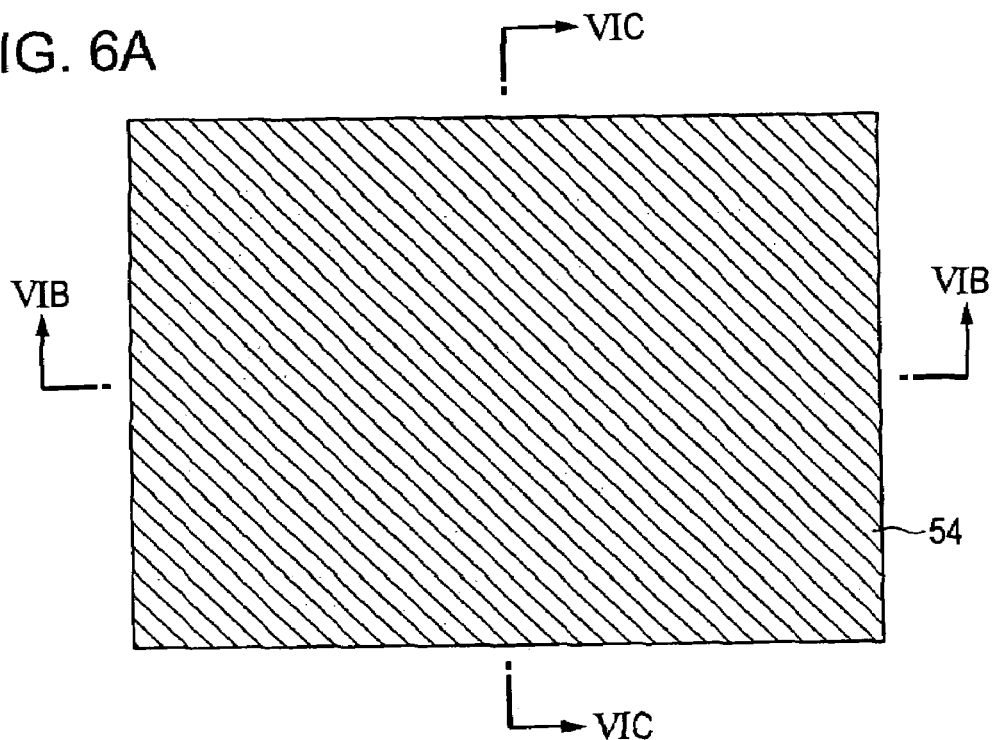
FIGS. 6A, 6B, and 6C are drawings showing a method for manufacturing a semiconductor device according to a third embodiment of the invention.
Figure 6B:
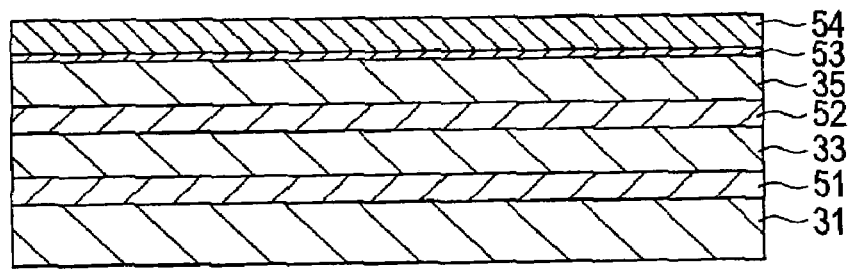
Figure 6C:
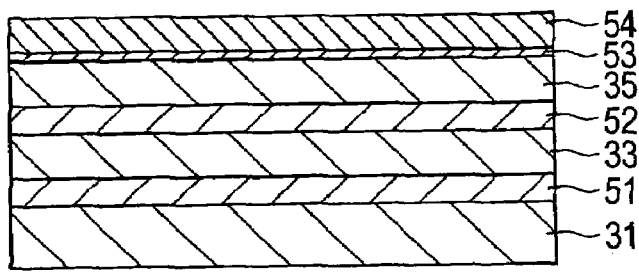

In FIGS. 6A, 6B, and 6C, single crystal semiconductor layers 51, 33, 52, and 35 are laminated on a semiconductor substrate 31 in that order. The single crystal semiconductor layers 51 and 52 can be formed using a material having a higher etching rate than that of a material for the semiconductor substrate 31 and the single crystal semiconductor layers 33 and 35. In particular, when the semiconductor substrate 31 is composed of Si, SiGe is preferably used for the single crystal semiconductor layers 51 and 52, and Si is preferably used for the single crystal semiconductor layers 31 and 35. In this case, a selection ratio can be secured between the single crystal semiconductor layers 51 and 52 and the single crystal semiconductor layers 33 and 35 while achieving lattice matching between the single crystal semiconductor layers 51 and 52 and the single crystal semiconductor layers 33 and 35, respectively. The single crystal semiconductor layer 33 is preferably doped with impurities of As, P, B, or the like to decrease the resistivity of the single crystal semiconductor layer 33.

Then, the single crystal semiconductor layer 35 is thermally oxidized to form a sacrificial oxide film 53 on the surface of the single crystal semiconductor layer 35. Then, an anti-oxidation film 54 is formed over the entire surface of the sacrificial oxide film 53. As the anti-oxidation film 54, for example, a silicon nitride film can be used.

Figure 7A:
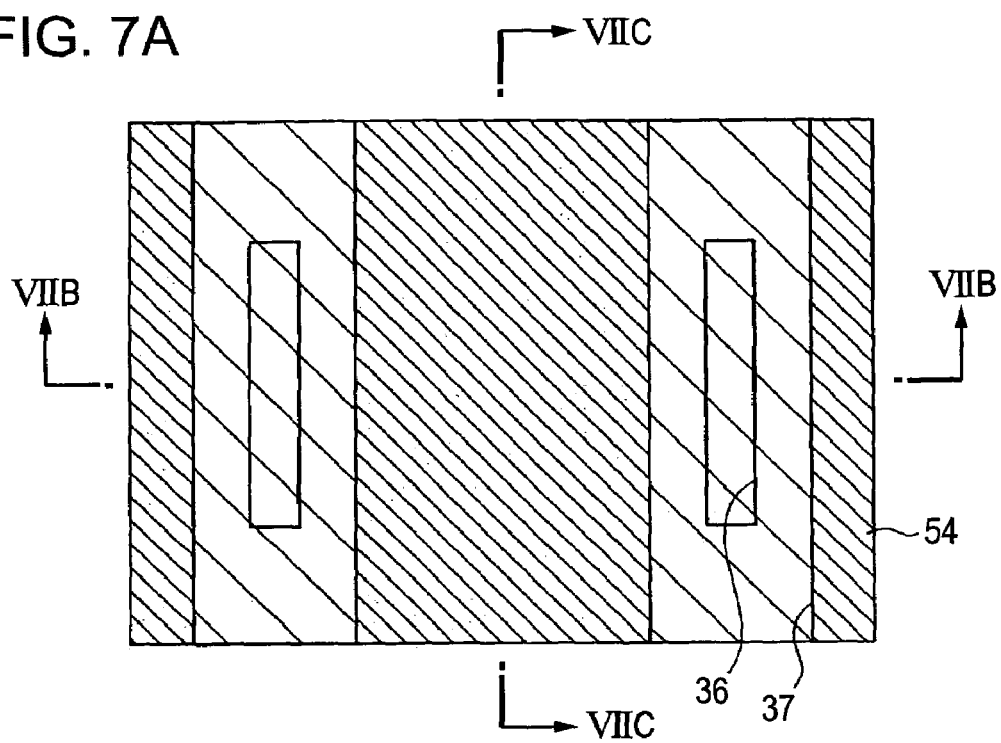
FIGS. 7A, 7B, and 7C are drawings showing the method for manufacturing the semiconductor device according to the third embodiment of the invention.
Figure 7B:
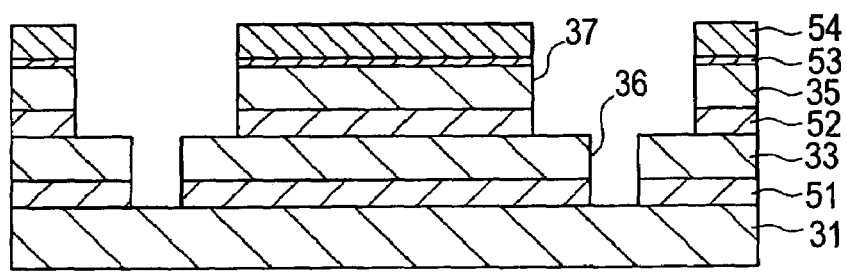
Figure 7C:
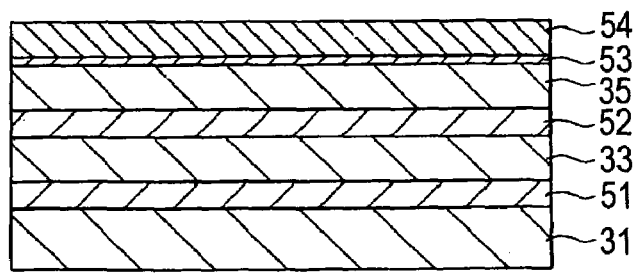

Next, as shown in FIGS. 7A, 7B, and 7C, the anti-oxidation film 54, the sacrificial oxide film 53, and the single crystal semiconductor layers 35, 52, 33, and 51 are patterned by photolithography and etching to form grooves 36 in a predetermined direction and expose the semiconductor substrate 31. In exposing the semiconductor substrate 31, etching may be stopped at the surface of the semiconductor substrate 31 or the semiconductor substrate 31 may be over-etched to form recesses in the semiconductor substrate 31. The positions of the grooves 36 can be determined to correspond to portions in a device isolation region for the single crystal semiconductor layer 33.

The anti-oxidation film 54, the sacrificial oxide film 53, and the single crystal semiconductor layers 35 and 52 are further patterned by photolithography and etching to form grooves 37 which are wider than the grooves 36 and disposed to overlap with the respective grooves 36, thereby partially exposing the surface of the single crystal semiconductor layer 33 near the both ends thereof. The positions of the grooves 37 can be determined to correspond to portions in a device isolation region for the single crystal semiconductor layer 35.

The etching may be stopped at the surface of the single crystal semiconductor layer 52 or may be performed to an intermediate position in the single crystal semiconductor layer 52 to over-etch the single crystal semiconductor layer 52 instead of exposing the surface of the single crystal semiconductor layer 33. When the etching is stopped at an intermediate position in the single crystal semiconductor layer 52, the surface of the single crystal semiconductor layer 33 can be prevented from being exposed in the grooves 36. Therefore, when the single crystal semiconductor layers 51 and 52 are etched off, the time of exposure of the single crystal semiconductor layer 33 to an etchant or etching gas in the grooves can be decreased, thereby suppressing over etching of the single crystal semiconductor layer 33 in the grooves 36.

Figure 8A:
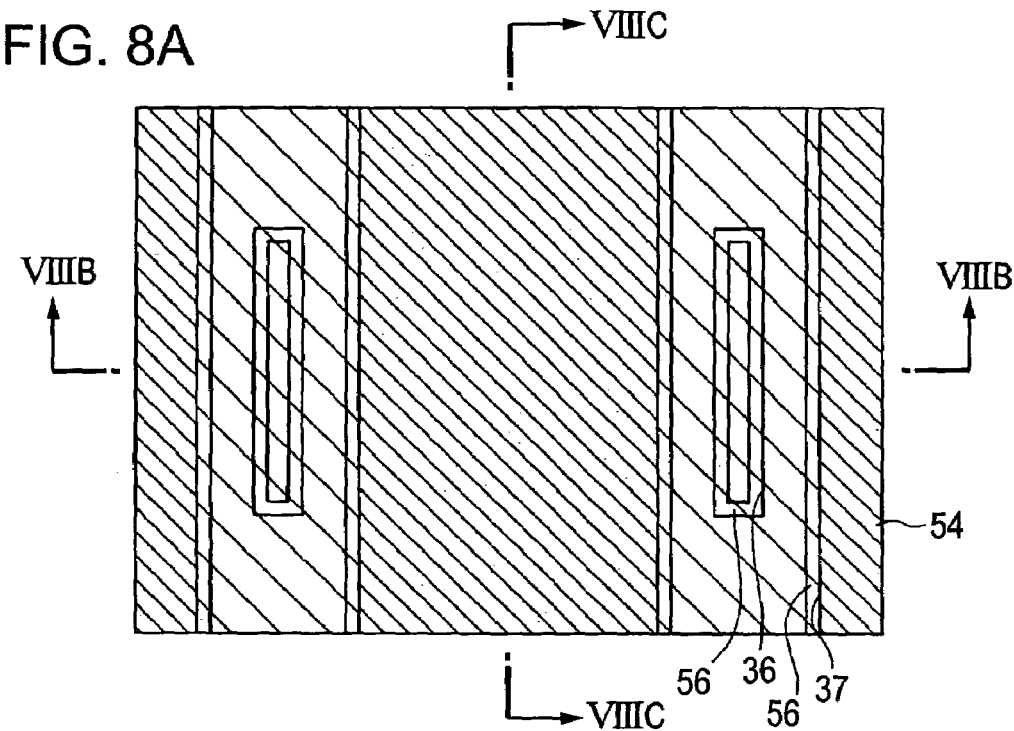
FIGS. 8A, 8B, and 8C are drawings showing the method for manufacturing the semiconductor device according to the third embodiment of the invention.
Figure 8B:
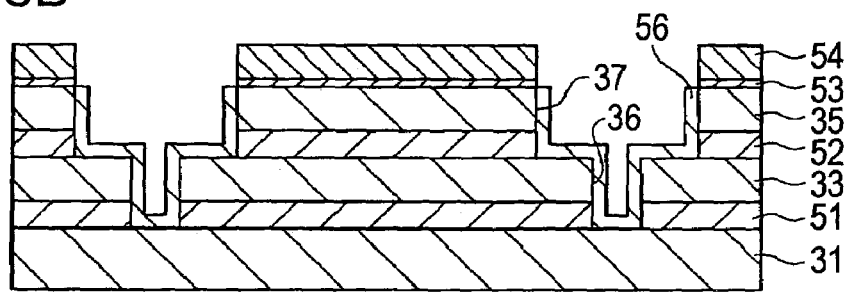
Figure 8C:
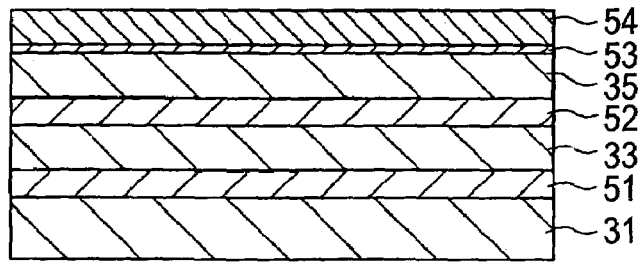

Next, as shown in FIGS. 8A, 8B, and 8C, supports 56 are formed in the grooves 36 and 37 by film deposition on the side walls of the single crystal semiconductor layers 33, 35, 51, and 52, for supporting the single crystal semiconductor layers 33 and 35 on the semiconductor substrate 31. In forming the supports 56 by film depositions on the side walls of the single crystal semiconductor layers 33, 35, 51, and 52, semiconductor epitaxial growth can be used. The use of semiconductor epitaxial growth permits the selective formation of the supports 56 on the surface of the semiconductor substrate 31 and on the side walls of the single crystal semiconductor layers 33, 35, 51, and 52. When the semiconductor substrate 31 and the single crystal semiconductor layers 33 and 35 are composed of Si, and the single crystal semiconductor layers 51 and 52 are composed of SiGe, Si is preferably used as a material for the supports 56.

In this case, a selection ratio can be secured between the supports 56 and the single crystal semiconductor layers 51 and 52 while achieving lattice matching between the supports 56 and the single crystal semiconductor layers 51 and 52. In addition, by using a semiconductor such as Si as a material for the supports 56, a three-dimensional semiconductor structure can be maintained even when the single crystal semiconductor layers 51 and 52 are removed. As a result, chemical resistance and mechanical stress resistance can be improved, and thus a process for stably isolating a device with high reproducibility can be realized. Instead of a semiconductor, an insulator such as a silicon oxide film or the like may be used as the material for the supports 56.

Figure 9A:
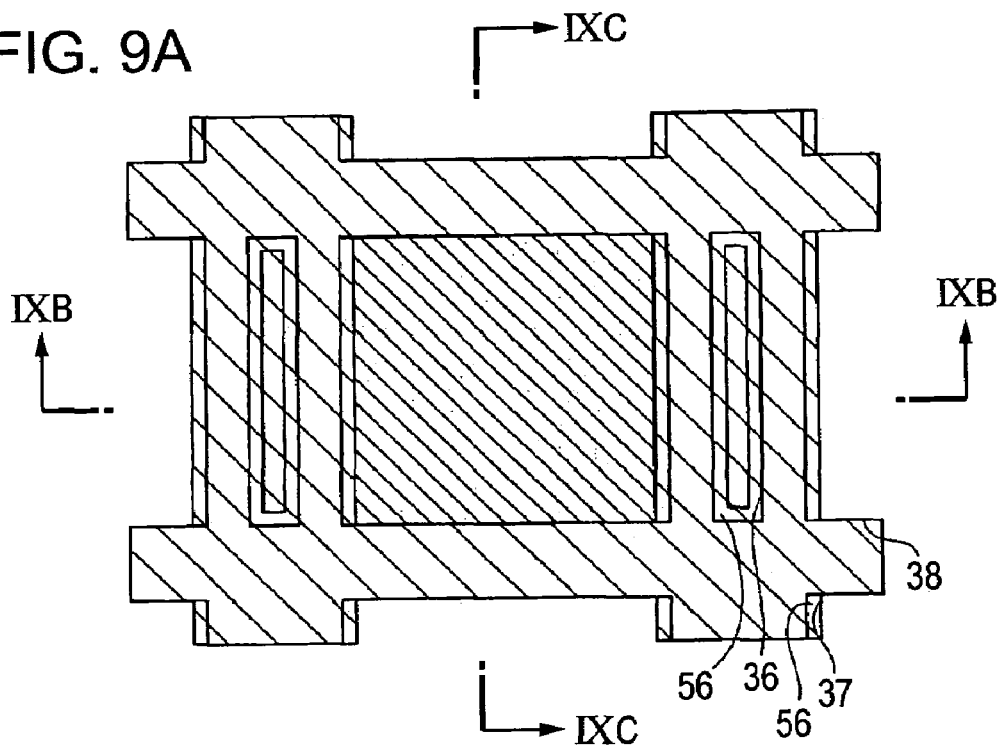
FIGS. 9A, 9B, and 9C are drawings showing the method for manufacturing the semiconductor device according to the third embodiment of the invention.
Figure 9B:
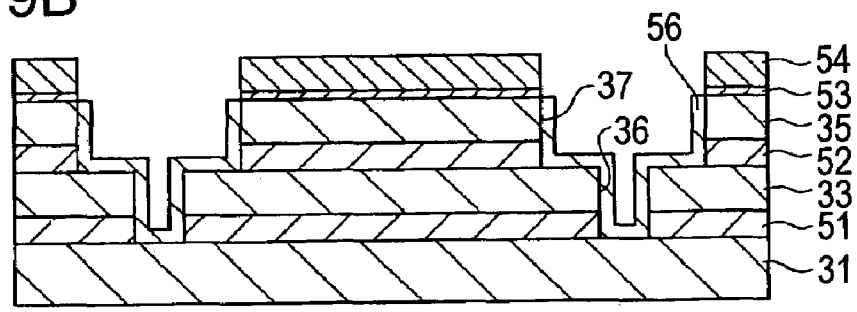
Figure 9C:
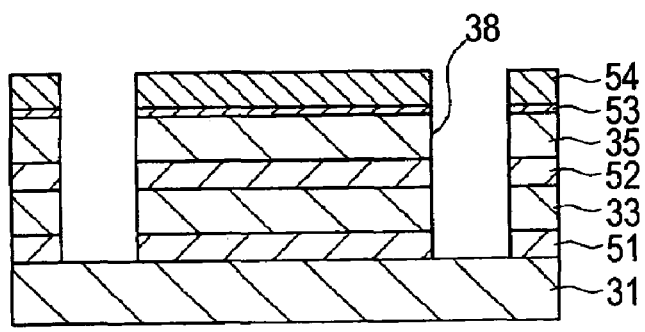

Next, as shown in FIGS. 9A, 9B, and 9C, the anti-oxidation film 54, the sacrificial oxide film 53, and the single crystal semiconductor layers 35, 52, 33, and 51 are patterned by photolithography and etching to form grooves 38 in a direction perpendicular to the grooves 36 and expose the semiconductor substrate 31. In exposing the semiconductor substrate 31, etching may be stopped at the surface of the semiconductor substrate 31 or the semiconductor substrate 31 may be over-etched to form recesses in the semiconductor substrate 31. The positions of the grooves 38 can be determined to correspond to the device isolation regions for the single crystal semiconductor layers 33 and 35.

Figure 10A:
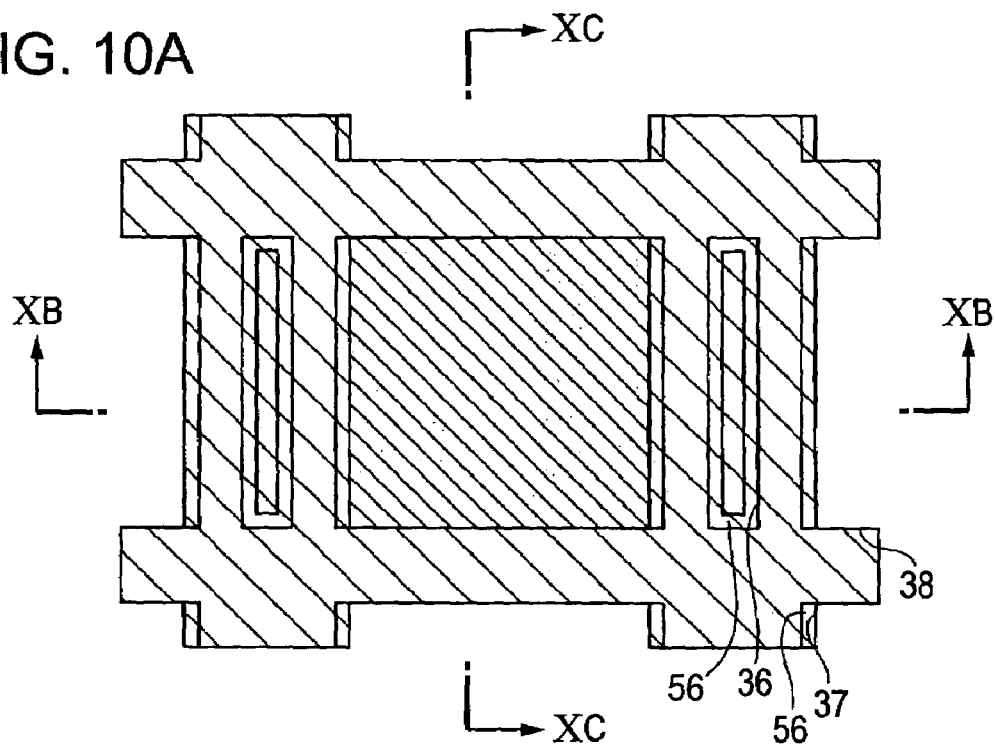
FIGS. 10A, 10B, and 10C are drawings showing the method for manufacturing the semiconductor device according to the third embodiment of the invention.
Figure 10B:
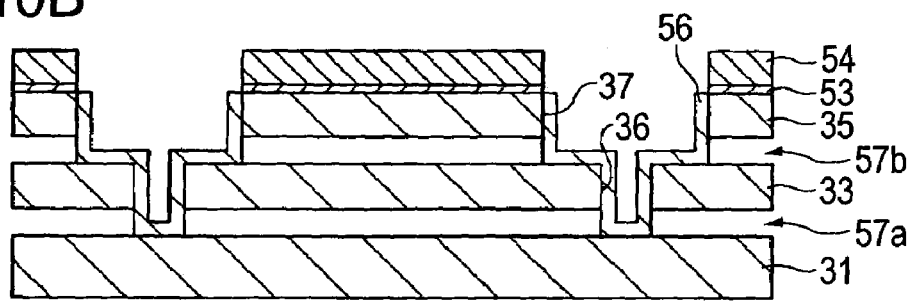
Figure 10C:
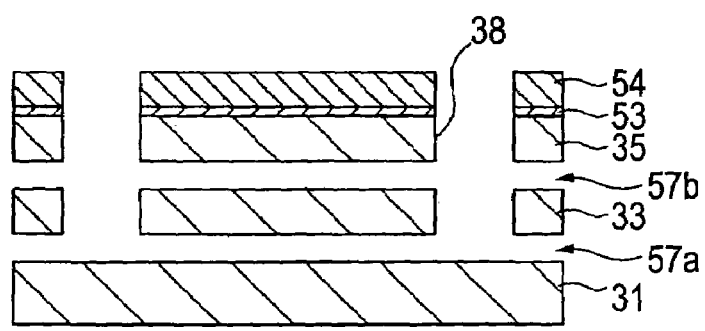

Next, as shown in FIGS. 10A, 10B, and 10C, the single crystal semiconductor layers 51 and 52 are etched off by contact with an etching gas or etchant through the grooves 38 to form cavities 57a between the semiconductor substrate 31 and the single crystal semiconductor layer 33 and cavities 57b between the single crystal semiconductor layers 33 and 35.

Since the supports 56 are provided in the grooves 36 and 37, the single crystal semiconductor layers 33 and 35 can be supported on the semiconductor substrate 31 even when the single crystal semiconductor layers 51 and 52 are removed. Also, since the grooves 38 are provided separately from the grooves 36 and 37, the etching gas or etchant can be brought into contact with the single crystal semiconductor layers Sand 52 disposed below the single crystal semiconductor layers 33 and 35, respectively. Therefore, insulation can be achieved between the single crystal semiconductor layers 33 and 35 and the semiconductor substrate 31 without degrading the crystal quality of the single crystal semiconductor layers 33 and 35.

When the semiconductor substrate 31, the single crystal semiconductor layers 33 and 35, and the supports 56 are composed of Si, and the single crystal semiconductor layers 51 and 52 are composed of SiGe, fluoronitric acid is preferably used as the etchant of the single crystal semiconductor layers 51 and 52. In this case, a selection ratio between Si and SiGe can be set to about 1:1,000 to 10,000, and thus the single crystal semiconductor layers 51 and 52 can be removed while suppressing over-etching of the semiconductor substrate 31, the single crystal semiconductor layers 33 and 35, and the supports 56.

Figure 11A:
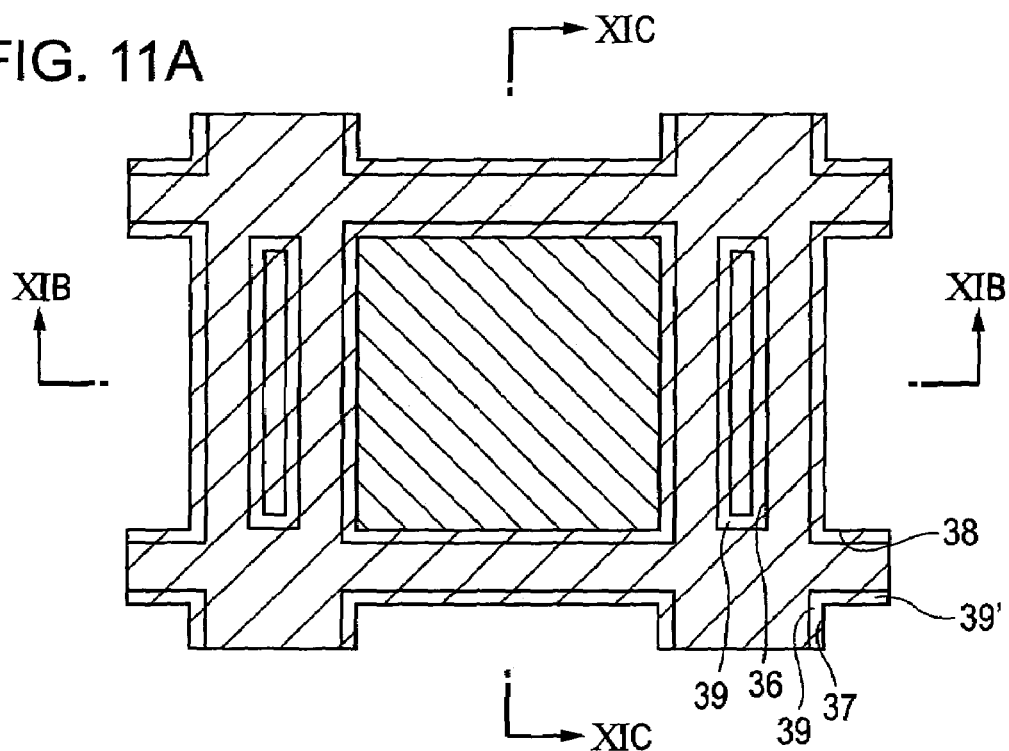
FIGS. 11A, 11B, and 11C are drawings showing the method for manufacturing the semiconductor device according to the third embodiment of the invention.
Figure 11B:
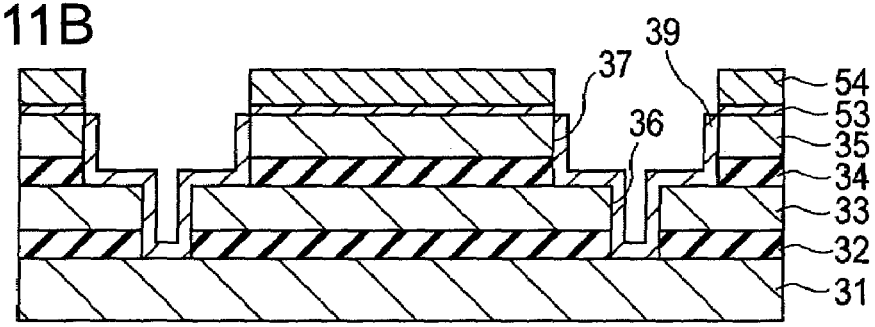
Figure 11C:
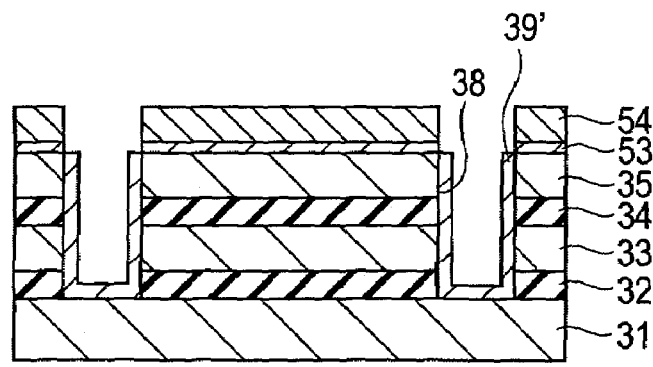

Next, as shown in FIGS. 11A, 11B, and 11C, the semiconductor substrate 31, the single crystal semiconductor layers 33 and 35, and the supports 56 are thermally oxidized to form insulating layers 32 in the cavities 57a between the semiconductor substrate 31 and the single crystal semiconductor layer 33 and also form insulating layers 34 in the cavities 57b between the single crystal semiconductor layers 33 and 35.

When the semiconductor substrate 31, the single crystal semiconductor layers 33 and 35, and the supports 56 are thermally oxidized to form the insulating layers 32 and 34, the semiconductor substrate 31 and the single crystal semiconductor layers 33 and 35 are oxidized within the grooves 38 to form oxide films 39' on the side walls of the grooves 38 and also convert the supports 56 to oxide films 39.

Therefore, the thicknesses of the single crystal semiconductor layers 33 and 35 after device isolation can be determined by the thicknesses of the single crystal semiconductor layers 33 and 35 after epitaxial growth and the thicknesses of the insulating layers 32 and 34 formed by thermal oxidation of the single crystal semiconductor layers 33 and 35, respectively. As a result, the thicknesses of the single crystal semiconductor layers 33 and 35 can be precisely controlled, and the thicknesses of the single crystal semiconductor layers 33 and 35 can be decreased while decreasing variations in the thicknesses of the single crystal semiconductor layers 33 and 35. Also, since the anti-oxidation film 54 is provided on the single crystal semiconductor layer 35, the insulating layer 34 can be formed at the back of the single crystal semiconductor layer 35 while preventing thermal oxidation of the surface of the single crystal semiconductor layer 35.

Furthermore, the positions of the grooves 36 and 38 are determined to correspond to the device isolation region for the single crystal semiconductor layer 33, and the positions of the grooves 37 and 38 are determined to correspond to the device isolation region for the single crystal semiconductor layer 35. Therefore, device isolation can be performed simultaneously in the transverse and longitudinal directions of the single crystal semiconductor layers 33 and 35, and additional grooves for removing the single crystal semiconductor layers 51 and 52 need not be provided in the device formation region. Consequently, a SOI transistor can be formed while suppressing an increase in number of steps, and an increase in chip size can be suppressed to permit a decrease the cost of the SOI transistor.

After the insulating layers 32 and 34 are formed, high-temperature annealing is performed. In this annealing, the insulating layers 32 and 34 can be re-flowed to decrease the stress of the insulating layers 32 and 34 and lower the interface states level.

Figure 12A:
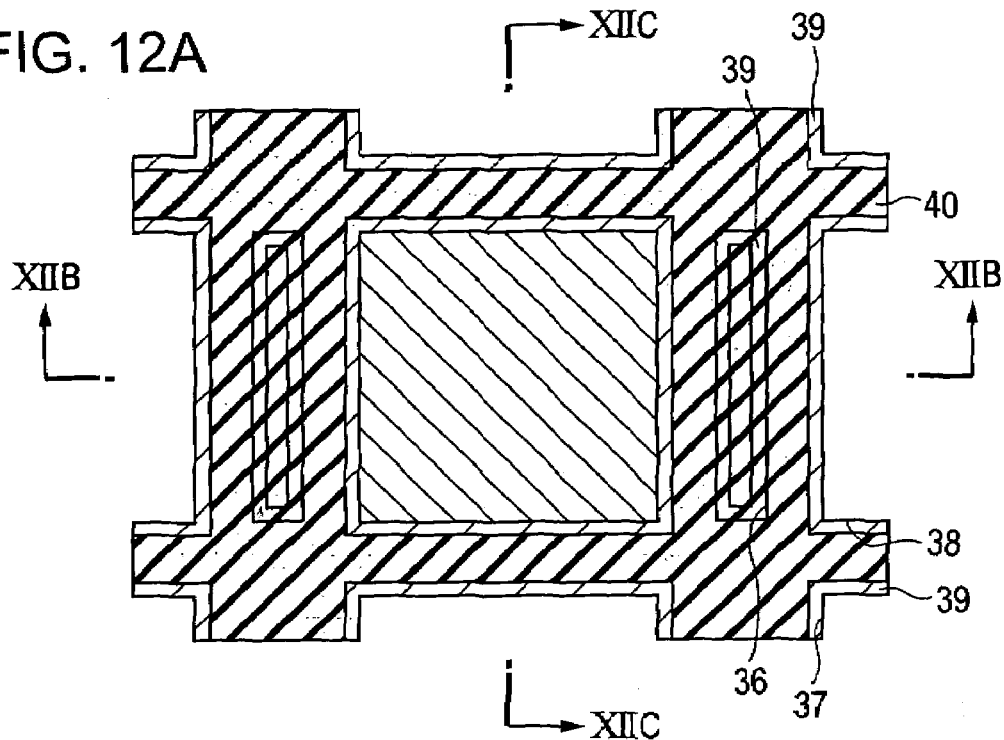
FIGS. 12A, 12B, and 12C are drawings showing the method for manufacturing the semiconductor device according to the third embodiment of the invention.
Figure 12B:
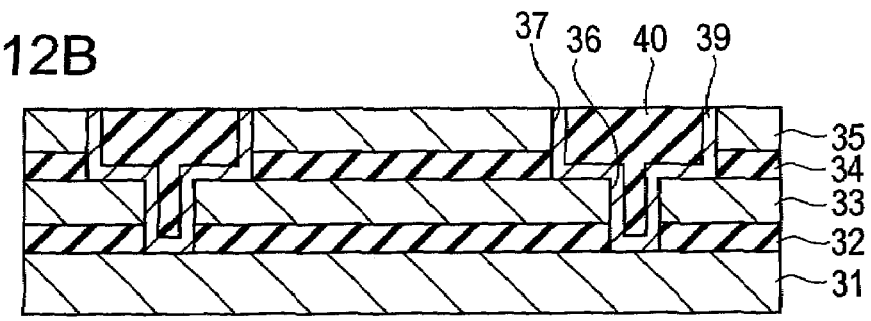
Figure 12C:
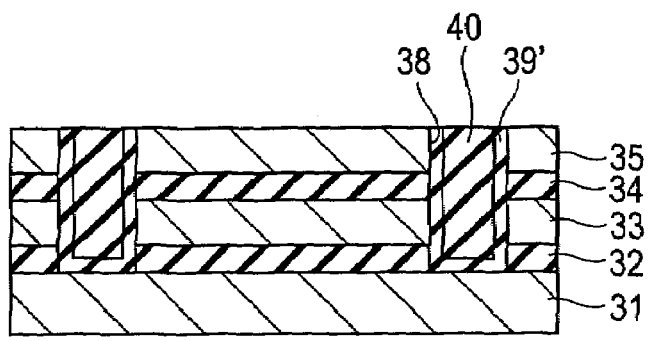

Next, as shown in FIGS. 12A, 12B, and 12C, an insulating layer is deposited on the anti-oxidation film 54, the sacrificial oxide film 53 and the single crystal semiconductor layer 35 by CVD or the like so as to fill in the grooves 36 and 37 and the grooves 38 in which the oxide films 39 and 39' have been formed respectively. Then, the insulating layer is planarized by CMP (chemical mechanical polishing), then the anti-oxidation film 54 and the sacrificial oxide film 53 is removed to expose the surface of the single crystal semiconductor layer 35 and form buried insulating layers 40 in the grooves 36, 37, and 38. For the buried insulating layers 40, for example, $SiO_2$ or $Si_3N_4$ can be used.

Figure 13A:
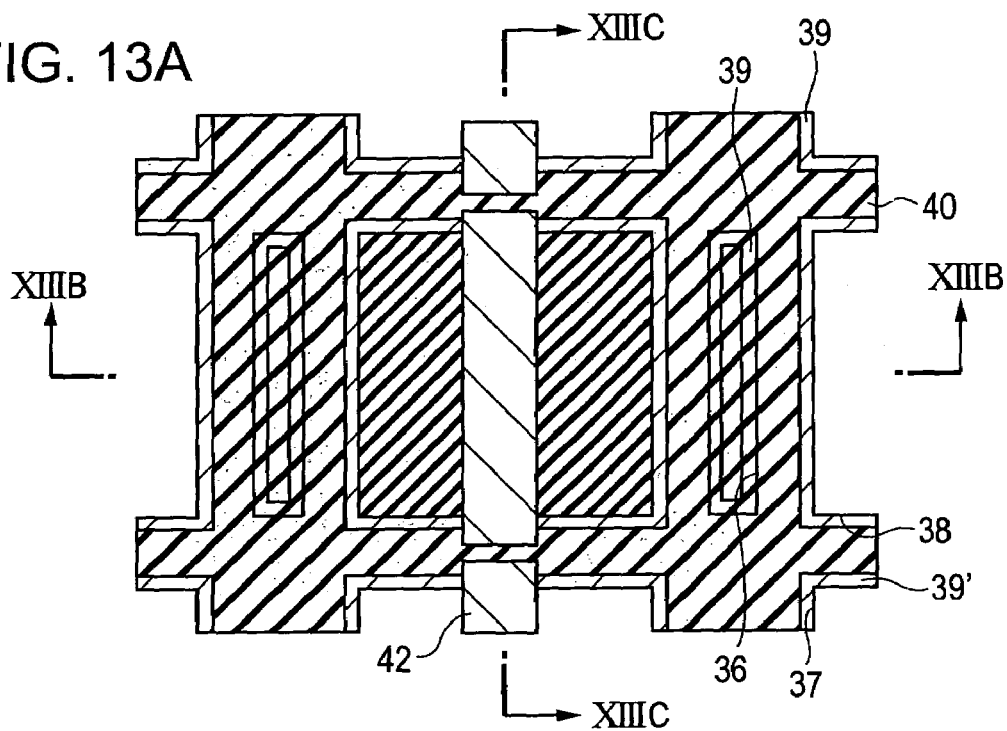
FIGS. 13A, 13B, and 13C are drawings showing the method for manufacturing the semiconductor device according to the third embodiment of the invention.
Figure 13B:
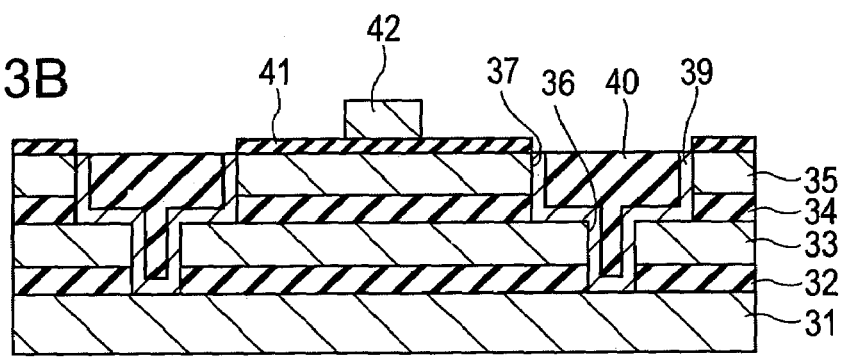
Figure 13C:
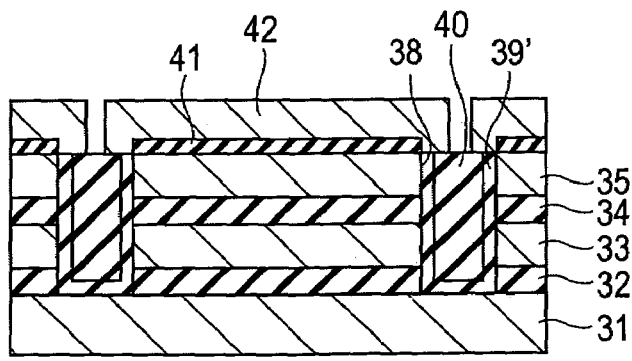

Next, as shown in FIGS. 13A, 13B, and 13C, the single crystal semiconductor layer 35 is thermally oxidized to form a gate insulating film 41 on the single crystal semiconductor layer 35. Then, a polycrystalline silicon layer is formed by CVD or the like on the single crystal semiconductor layer 35 on which the gate insulating film 41 has been formed, and the polycrystalline silicon layer is patterned by photolithography and etching to form a gate electrode 42 on the gate insulating film 41.

Figure 14A:
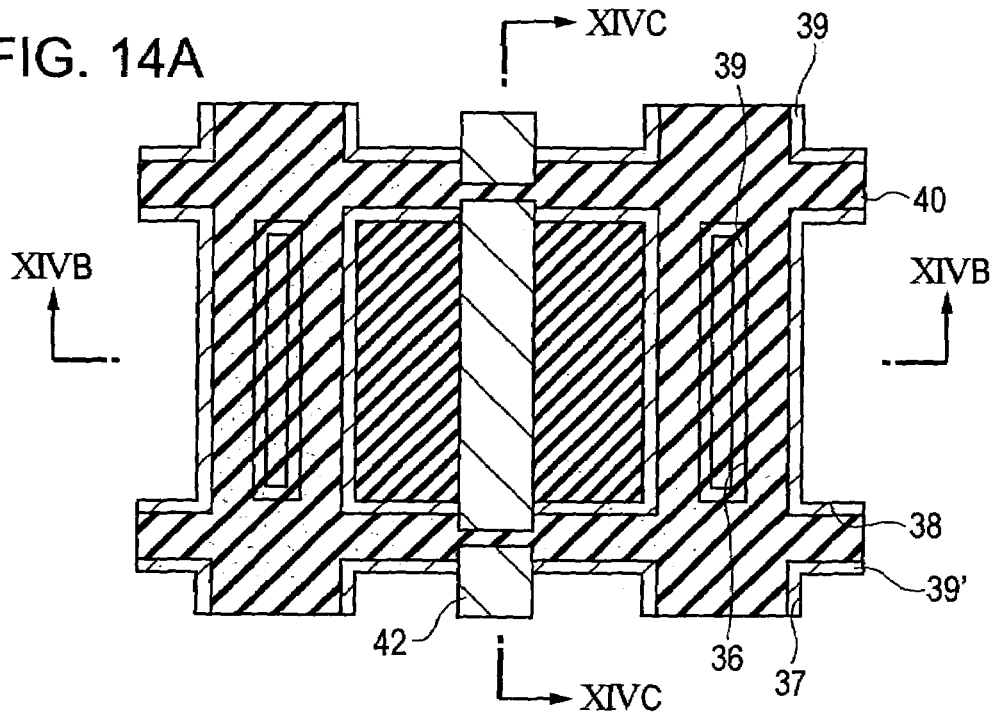
FIGS. 14A, 14B, and 14C are drawings showing the method for manufacturing the semiconductor device according to the third embodiment of the invention.
Figure 14B:
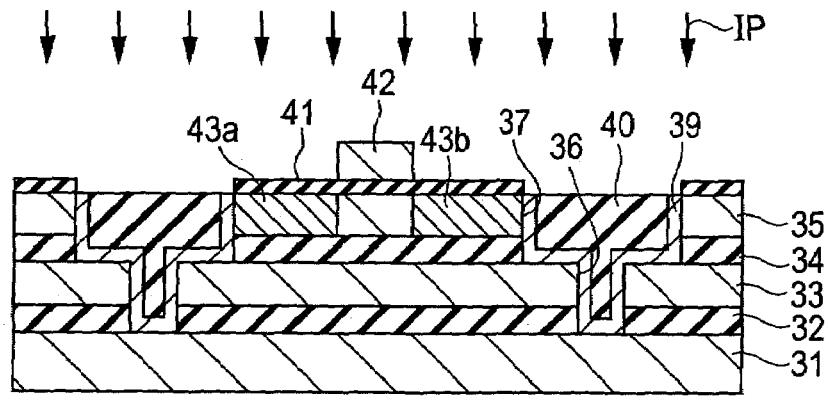
Figure 14C:
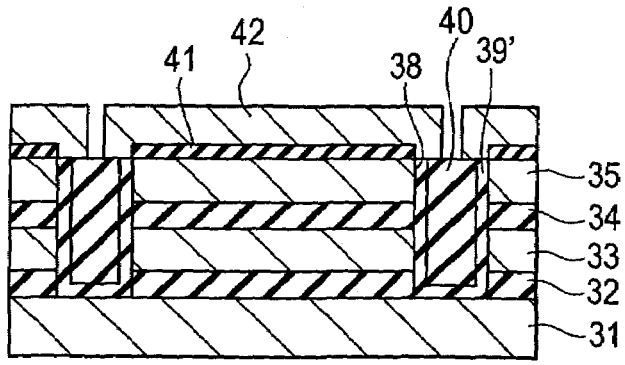

Next, as shown in FIGS. 14A, 14B, and 14C, impurity ions of As, P, B, or the like are implanted in the single crystal semiconductor layer 35 using the gate electrode 42 as a mask to form source and drain layers 43a and 43b in the single crystal semiconductor layer 35 on the sides of the gate electrode 42, the source and drain layers 43a and 43b each comprising a heavily-doped impurity layer. In addition, impurity ions of As, P, B, or the like may be implanted in the single crystal semiconductor layer 33 to decrease the resistivity of the single crystal semiconductor layer 33.

Figure 15A:
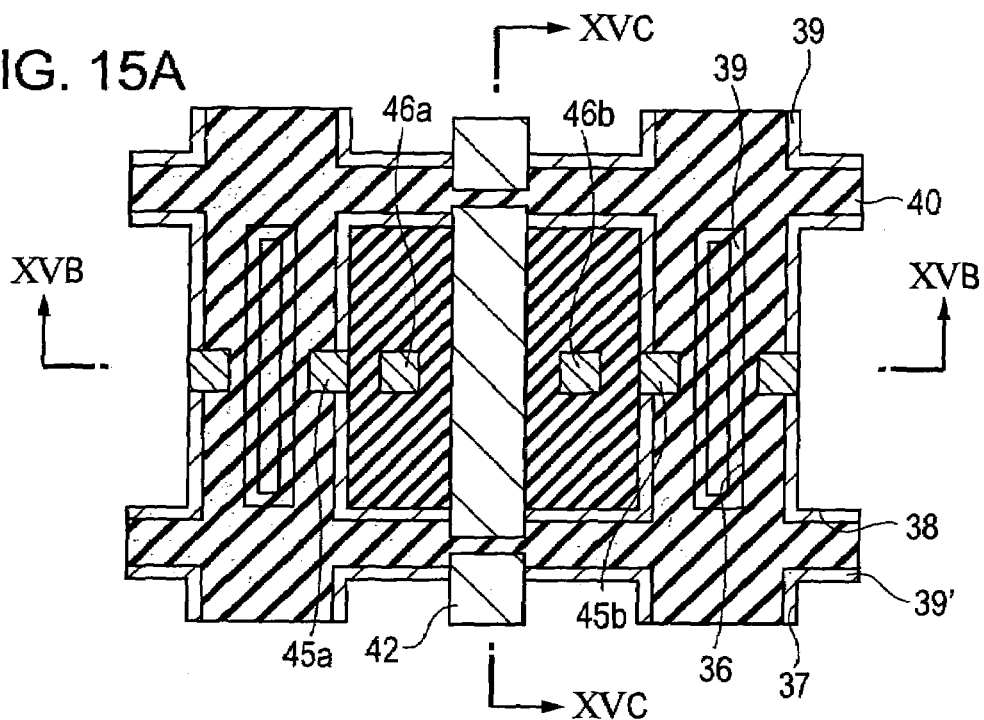
FIGS. 15A, 15B, and 15C are drawings showing the method for manufacturing the semiconductor device according to the third embodiment of the invention.
Figure 15B:
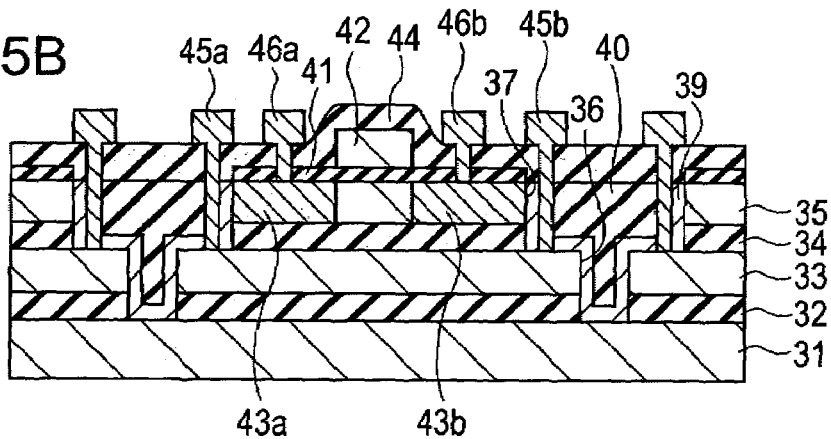
Figure 15C:
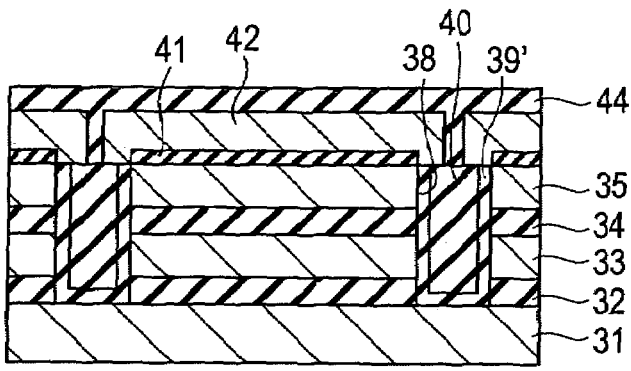

Next, as shown in FIGS. 15A, 15B, and 15C, an interlayer insulating film 44 is formed over the entire surface by plasma CVD or the like, and then the interlayer insulating film 44 is patterned by photolithography and etching to form openings for exposing the surfaces of the source layer 43a and the drain layer 43b. Then, the interlayer insulating film 44, the buried insulating films 40, and the oxide films 39 are patterned by photolithography and etching to form openings for partially exposing the surface of the single crystal semiconductor layer 33.

Then, a conductive layer is deposited on the interlayer insulating film 44 by CVD or the like so as to fill in the openings, and the conductive layer is patterned by photolithography and etching to form wiring layers 46a and 46b on the interlayer insulating film 44, for making contact with the source and drain layers 43a and 43b, respectively, and form wiring layers 45a and 45b on the interlayer insulating film 44, for making contact with the single crystal semiconductor layer 33. The wiring layers 45a, 45b, 46a and 46b can be formed in any pattern using a circuit. For example, when a pattern for connecting the wiring layers 45a and 46b is formed, the source and field plate can be brought at the same potential.

Figure 16A:
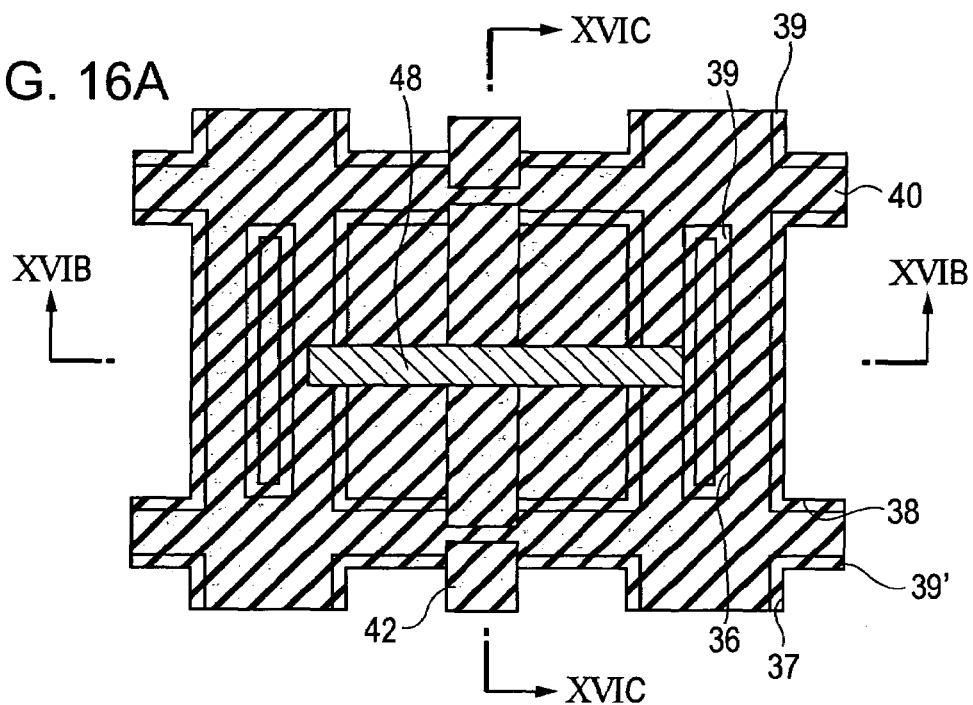
FIGS. 16A, 16B, and 16C are drawings showing the method for manufacturing the semiconductor device according to the third embodiment of the invention.
Figure 16B:
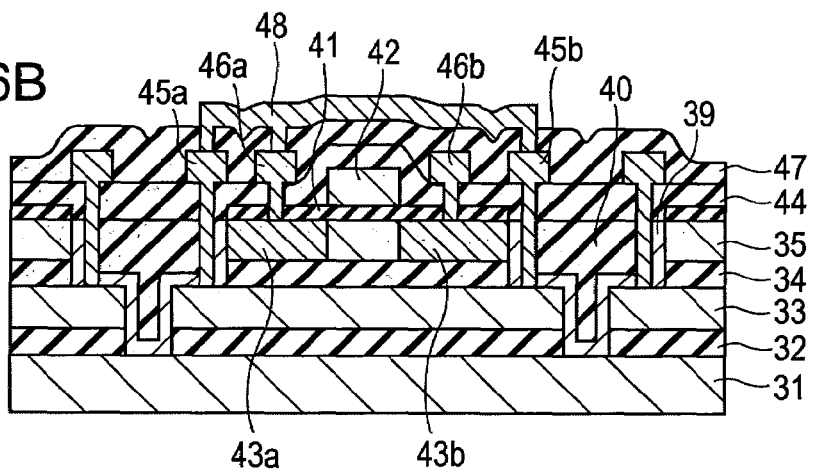
Figure 16C:
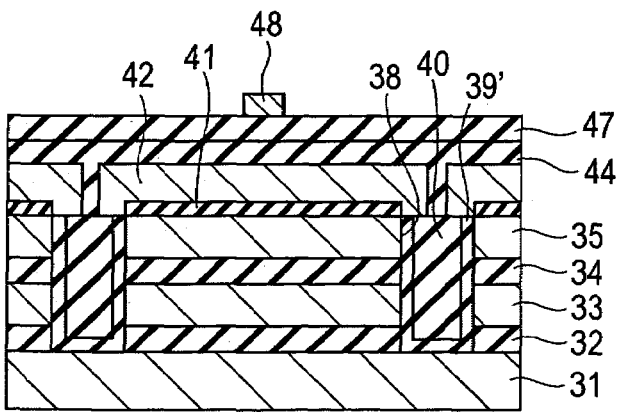

Next, as shown in FIGS. 16A, 16B, and 16C, an interlayer insulating film 47 is formed over the entire surface by plasma CVD or the like, and then the interlayer insulating film 47 is patterned by photolithography and etching to form openings for exposing the surfaces of the wiring layers 45a, 45b, and 46a. Then, a conductive layer is deposited on the interlayer insulating film 47 by CVD or the like so as to fill in the openings formed in the interlayer insulating film 47, and the conductive layer is patterned by photolithography and etching to form wiring layers 48 on the interlayer insulating film 47, for connecting the wiring layers 45a, 45b, and 46a to each other.

As a result, a BOX layer can be formed by thermal oxidation of the semiconductor layers 33 and 35, and a SOI transistor can be formed without degrading the crystal quality of the semiconductor layers 33 and 35. Also, a low-resistance field plate including a single crystal can be formed at the back of the semiconductor layer 35 in which the SOI transistor has been formed. Therefore, the field plate can be disposed in a portion where an electric field is concentrated without undergoing limitations of arrangement of the gate electrode 42 and the wiring layers 46a and 46b. Consequently, the breakdown voltage of a field-effect transistor can be improved while decreasing the power consumption and driving voltage of the field-effect transistor and increasing the operation speed thereof.

What is claimed is:

1. A method for manufacturing a semiconductor device comprising:

forming a plurality of laminated structure layers on a semiconductor substrate, the laminated structure layers each including a first semiconductor layer and a second semiconductor layer formed on the first semiconductor layer and having a lower etching rate than that of the first semiconductor layer, wherein the first and second semiconductor layers both have a back surface and a top surface;

providing a step to expose the top surface of the second semiconductor layer in the lower laminated structure layer and forming a first groove passing through the first and second semiconductor layers to expose the semiconductor substrate and create first groove sidewalls;

forming supports on the first groove side walls of the first and second semiconductor layers in the first groove, for supporting the second semiconductor layers on the semiconductor substrate;

forming a second groove to expose at least a portion of the first semiconductor layer, on which the supports have been formed on the side walls, from the second semiconductor layers;

selectively etching the first semiconductor layers through the second groove to partially remove the first semiconductor layers and form a first cavity intermediate the semiconductor substrate and second semiconductor layer closer to the semiconductor substate as well as a second cavity intermediate the second semiconductor layers;

thermally oxidizing the semiconductor substrate and the second semiconductor layers through the first and second grooves to fill in the cavities and form insulating layers at the back surfaces of the second semiconductor layers;

thermally oxidizing the uppermost second semiconductor layer to form a gate insulating film on the top surface of the uppermost second semiconductor layer;

forming a gate electrode on the uppermost second semiconductor layer with the gate insulating film formed therebetween; and implanting ions using the gate electrode as a mask to form source and drain layers in the uppermost second semiconductor layer on both sides of the gate electrode.

2. A method as recited in claim 1, wherein the first and second semiconductor layers are single crystal semiconductor layers.

3. A method as recited in claim 1, wherein the semiconductor substrate is overetched to form recesses.

4. A method as recited in claim 1, further comprising the step of thermally oxidizing to form a sacrificial oxide film on the uppermost semiconductor layer.

5. A method as recited in claim 1, wherein the supports are Si formed by epitaxial growth.

6. A method as recited in claim 1, further comprising the step of converting the supports to oxide films.

7. A method as recited in claim 1, further comprising the step of implanting impurity ions into at least one of the first semiconductor layers.

* * * * *